(12) United States Patent
Lee et al.

(10) Patent No.: US 10,062,811 B2
(45) Date of Patent: Aug. 28, 2018

(54) LIGHT-EMITTING ELEMENT AND LIGHT-EMITTING ELEMENT ARRAY COMPRISING THE SAME

(71) Applicant: LG INNOTEK CO., LTD., Seoul (KR)

(72) Inventors: Keon Hwa Lee, Seoul (KR); Su Hyoung Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/540,507

(22) PCT Filed: Nov. 27, 2015

(86) PCT No.: PCT/KR2015/012843
§ 371 (c)(1),
(2) Date: Jun. 28, 2017

(87) PCT Pub. No.: WO2016/108437
PCT Pub. Date: Jul. 7, 2016

(65) Prior Publication Data
US 2017/0365744 A1     Dec. 21, 2017

(30) Foreign Application Priority Data
Dec. 29, 2014   (KR) .................. 10-2014-0191942

(51) Int. Cl.
*H01L 29/15* (2006.01)
*H01L 33/38* (2010.01)
(Continued)

(52) U.S. Cl.
CPC ............ *H01L 33/385* (2013.01); *H01L 33/06* (2013.01); *H01L 33/20* (2013.01); *H01L 33/30* (2013.01); *H01L 33/405* (2013.01)

(58) Field of Classification Search
CPC ....... H01L 33/385; H01L 33/06; H01L 33/20; H01L 33/30; H01L 33/405
(Continued)

(56) References Cited

U.S. PATENT DOCUMENTS 6,875,627 B2   4/2005 Bour et al.
8,987,763 B2 * 3/2015 Aoyagi .................. H01L 33/62
                                                                    257/100
(Continued)

FOREIGN PATENT DOCUMENTS

JP   2003-008056   1/2003
JP   2014-157948   8/2014
(Continued)

OTHER PUBLICATIONS

International Search Report (with English Translation) and Written Opinion dated Mar. 9, 2016 issued in Application No. PCT/KR2015/012843.

*Primary Examiner* — Tu-Tu Ho
(74) *Attorney, Agent, or Firm* — KED & Associates, LLP

(57) ABSTRACT

Embodiments of a light-emitting element and a light-emitting element array comprise: a light-emitting structure which includes a first conductive type semiconductor layer, an active layer, and a second conductive type semiconductor layer; first and second electrodes which are disposed respectively on the first and second conductive type semiconductor layers; and an insulation layer which is disposed on the light-emitting structure exposed between the first electrode and the second electrode, wherein the second electrode comprises a light-emitting element including: a first part which overlaps with the second conductive type semiconductor layer in the thickness direction of the light-emitting structure; and a second part which extends from the first part and does not overlap with the second conductive type semiconductor layer in the thickness direction, thereby (Continued)

being capable of improving the productivity of a light-emitting element manufacturing process while minimizing the light leakage phenomenon between the light-emitting structure and the second electrode.

19 Claims, 7 Drawing Sheets

(51) Int. Cl.
- *H01L 33/30* (2010.01)
- *H01L 33/40* (2010.01)
- *H01L 33/20* (2010.01)
- *H01L 33/06* (2010.01)

(58) Field of Classification Search
USPC .................................................. 257/72, 99
See application file for complete search history.

(56) References Cited

U.S. PATENT DOCUMENTS

| | | | |
|---|---|---|---|
| 2008/0018245 A1* | 1/2008 | Kim | H01L 27/3253 313/512 |
| 2012/0034714 A1* | 2/2012 | Tsai | H01L 33/0095 438/16 |
| 2012/0299038 A1* | 11/2012 | Hwang | H01L 33/385 257/98 |
| 2013/0181249 A1* | 7/2013 | Aoyagi | H01L 33/62 257/99 |

FOREIGN PATENT DOCUMENTS

| | | |
|---|---|---|
| KR | 10-0682878 | 2/2007 |
| KR | 10-0966372 | 6/2010 |
| KR | 10-2012-0041646 | 5/2012 |
| KR | 10-2012-0044739 | 5/2012 |
| KR | 10-2014-0080992 | 7/2014 |

* cited by examiner

⋮

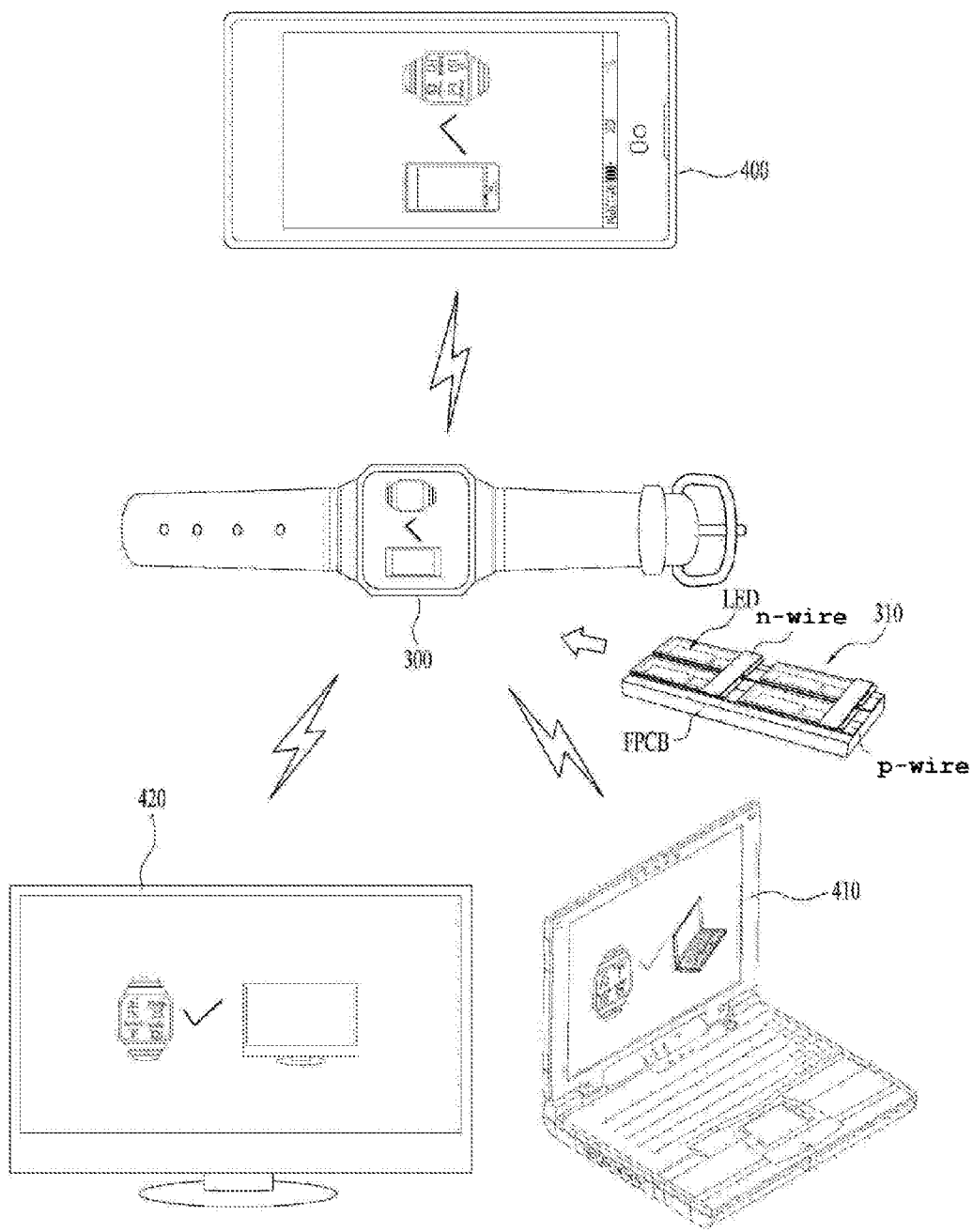

LIGHT-EMITTING ELEMENT AND LIGHT-EMITTING ELEMENT ARRAY COMPRISING THE SAME

CROSS-REFERENCE TO RELATED PATENT APPLICATIONS

This application is a U.S. National Stage Application under 35 U.S.C. § 371 of PCT Application No. PCT/KR2015/012843, filed Nov. 27, 2015, which claims priority to Korean Patent Application No. 10-2014-0191942, filed Dec. 29, 2014, whose entire disclosures are hereby incorporated by reference.

TECHNICAL FIELD

Embodiments relate to a light-emitting element and a light-emitting element array having the same.

BACKGROUND ART

Group III-V compound semiconductors such as, for example, GaN and AlGaN, are widely used for optoelectronics, electronic devices and the like, owing to many advantages such as, for example, a wide and easily adjustable band gap energy.

In particular, light-emitting elements such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as, for example, fluorescent lamps and incandescent lamps.

Accordingly, the application of light-emitting elements has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

In addition, light-emitting diodes having excellent optical characteristics and a small size have recently been developed because the application thereof to light sources of, for example, portable appliances or lighting apparatuses is on the rise.

Although attempts have been made to form a pixel by reducing the cross-sectional area of a light-emitting structure in order to realize a small light-emitting diode, since the thickness of each light-emitting structure is too large, it is difficult to realize a super-thin-type unit pixel.

That is, the light-emitting structure of the light-emitting diode described above is grown on a substrate formed of, for example, sapphire. For example, in the case of a horizontal-type light-emitting element in which the substrate remains after the light-emitting structure is grown and a vertical-type light-emitting element in which a metal support is coupled to one side of the light-emitting structure and then the substrate is removed, since the substrate or the metal support is too thick, it is difficult to form a super-thin-type pixel.

Technical Object

Embodiments provide a super-thin-type light-emitting element having no growth substrate or metal support member.

Technical Solution

One embodiment provides a light-emitting element including a light-emitting structure including a first conductive type semiconductor layer, an active layer, and a second conductive type semiconductor layer, first and second electrodes disposed respectively on the first and second conductive type semiconductor layers, and an insulation layer disposed on the light-emitting structure that is exposed between the first electrode and the second electrode, wherein the second electrode includes a first portion configured to overlap the second conductive type semiconductor layer in a thickness direction of the light-emitting structure, and a second portion configured to extend from the first portion so as not to overlap the second conductive type semiconductor layer in the thickness direction.

Another embodiment provides a light-emitting element including a light-emitting structure including a first conductive type semiconductor layer, an active layer, and a second conductive type semiconductor layer, first and second electrodes disposed respectively on the first and second conductive type semiconductor layers, and an insulation layer disposed on the light-emitting structure that is exposed between the first electrode and the second electrode, wherein the second electrode and the second conductive type semiconductor layer are disposed so as to deviate by x1, which is a misalignment distance, in a thickness direction of the light-emitting structure.

The light-emitting structure may include a first mesa area, the first conductive type semiconductor layer may include a second mesa area, the insulation layer may be disposed on the first mesa area and the second mesa area and may include an open area in which the second conductive type semiconductor layer is exposed on the first mesa area, at least a portion of the second electrode may be disposed on the open area, and at least a portion of the second conductive type semiconductor layer, the insulation layer, and the second electrode may overlap one another at an outer periphery of the open area on the first mesa area.

A width of an upper surface of the second electrode in a first direction may be a1, a width of the second conductive type semiconductor layer in the first direction may be a2, and a distance between opposite edges of the insulation layer that face each other in the first direction on the first mesa area may be a3.

Here, a relationship $a2 < a1 < a3$ may be established.

The x1 may range from 1% to 15% of the a2.

The x1 may range from 1 μm to 4 μm.

In addition, a width of an upper surface of the second electrode in a first direction may be a1, and a width of the second conductive type semiconductor layer in the first direction may be a2.

Here, a relationship $a1 = a2$ may be established.

In addition, a width of an upper surface of the second electrode in a first direction may be a1, a width of the upper surface of the second electrode in a second direction, which is perpendicular to the first direction, may be b1, a width of an upper surface of the second conductive type semiconductor layer in the first direction that is included in the first mesa area may be a2, and a width of the upper surface of the second conductive type semiconductor layer in the second direction, which is perpendicular to the first direction, may be b2.

Here, a relationship a1=b1 and a2=b2 may be established.

An area of an upper surface of the second electrode may be the same as a horizontal cross-sectional area of the second conductive type semiconductor layer, and the horizontal cross-sectional area may be an area of a horizontal plane perpendicular to the thickness direction.

At least one side surface of the second electrode may be disposed on the same plane as at least one side surface of the second conductive type semiconductor layer.

An area of an upper surface of the second electrode may be greater than a horizontal cross-sectional area of the second conductive type semiconductor layer and may be equal to or less than a horizontal cross-sectional area including the insulation layer disposed on the second conductive type semiconductor layer and the second conductive type semiconductor layer, and the horizontal cross-sectional area is an area of a horizontal plane perpendicular to the thickness direction.

At least one side surface of the second electrode may be disposed on the same plane as at least one side surface of the insulation layer disposed on the second conductive type semiconductor layer.

A side surface of the second electrode may be disposed between an extension plane of a side surface of the second conductive type semiconductor layer and an extension plane of a side surface of the insulation layer on the first mesa area.

The first electrode may be disposed on a portion of the second mesa area, and the first electrode may be disposed on a side surface of the second mesa area and extends from an edge of the side surface.

The first electrode may include an ohmic layer, a reflective layer, and a coupling layer, the second electrode may include an ohmic layer and a reflective layer, the insulation layer may have a DBR structure, and the DBR structure may be a structure in which $TiO_2$ and $SiO_2$, or $Ta_2O_5$ and $SiO_2$ are repeatedly disposed at least two times.

The first electrode may come into contact at a first surface thereof with the insulation layer, and a portion of a second surface that faces the first surface may be exposed.

Another embodiment provides a light-emitting element array including a circuit board, a plurality of light-emitting elements according to claim 1 or 2 disposed on the circuit board, and a resin layer filled up with between the circuit board and the light-emitting elements and including a conductive ball, wherein the conductive ball is in contact with each of the circuit board and the second electrodes of the light-emitting elements.

The first electrodes of the light-emitting elements may be interconnected using a single electrode wire in a direction opposite to the circuit board.

Another embodiment provides a display apparatus including a bottom cover, a reflector disposed on the bottom cover, a light-emitting element array configured to emit light, a light guide plate disposed in front of the reflector and configured to guide the light emitted from the light-emitting element array forward, an optical sheet including prism sheets disposed in front of the light guide plate, a display panel disposed in front of the optical sheet, an image signal output circuit connected to the display panel and configured to supply an image signal to the display panel, and a color filter disposed in front of the display panel, wherein the light-emitting element array includes a plurality of light-emitting elements disposed on a circuit board, and a resin layer filled up with between the circuit board and the light-emitting elements and including a conductive ball, wherein the conductive ball is in contact with each of the circuit board and a second electrode of each of the light-emitting elements, wherein each of the light-emitting elements includes a light-emitting structure including a first conductive type semiconductor layer, an active layer, and a second conductive type semiconductor layer, a first electrode and the second electrode disposed respectively on the first and second conductive type semiconductor layers, and an insulation layer disposed on the light-emitting structure that is exposed between the first electrode and the second electrode, and wherein the second electrode includes a first portion configured to overlap the second conductive type semiconductor layer in a thickness direction of the light-emitting structure, and a second portion configured to extend from the first portion so as not to overlap the second conductive type semiconductor layer in the thickness direction.

A further embodiment provides a display apparatus including a bottom cover, a reflector disposed on the bottom cover, a light-emitting element array configured to emit light, a light guide plate disposed in front of the reflector and configured to guide the light emitted from the light-emitting element array forward, an optical sheet including prism sheets disposed in front of the light guide plate, a display panel disposed in front of the optical sheet, an image signal output circuit connected to the display panel and configured to supply an image signal to the display panel, and a color filter disposed in front of the display panel, wherein the light-emitting element array includes a plurality of light-emitting elements disposed on a circuit board, and a resin layer filled up with between the circuit board and the light-emitting elements and including a conductive ball, wherein the conductive ball is in contact with each of the circuit board and a second electrode of each of the light-emitting elements, wherein each of the light-emitting elements includes a light-emitting structure including a first conductive type semiconductor layer, an active layer, and a second conductive type semiconductor layer, a first electrode and the second electrode disposed respectively on the first and second conductive type semiconductor layers, and an insulation layer disposed on the light-emitting structure that is exposed between the first electrode and the second electrode, and wherein the second electrode and the second conductive type semiconductor layer are disposed so as to be misaligned with each other in a thickness direction of the light-emitting structure.

Advantageous Effects

A light-emitting element and a light-emitting element array comprising the same according to embodiments may minimize a light-leakage phenomenon by limiting the range over which a second electrode deviates from an emitting area of a light-emitting structure, and may also improve productivity by securing a processing margin.

DESCRIPTION OF DRAWINGS

FIG. 10 is a view illustrating an embodiment of a smart watch.

BEST MODE

Figure 1:
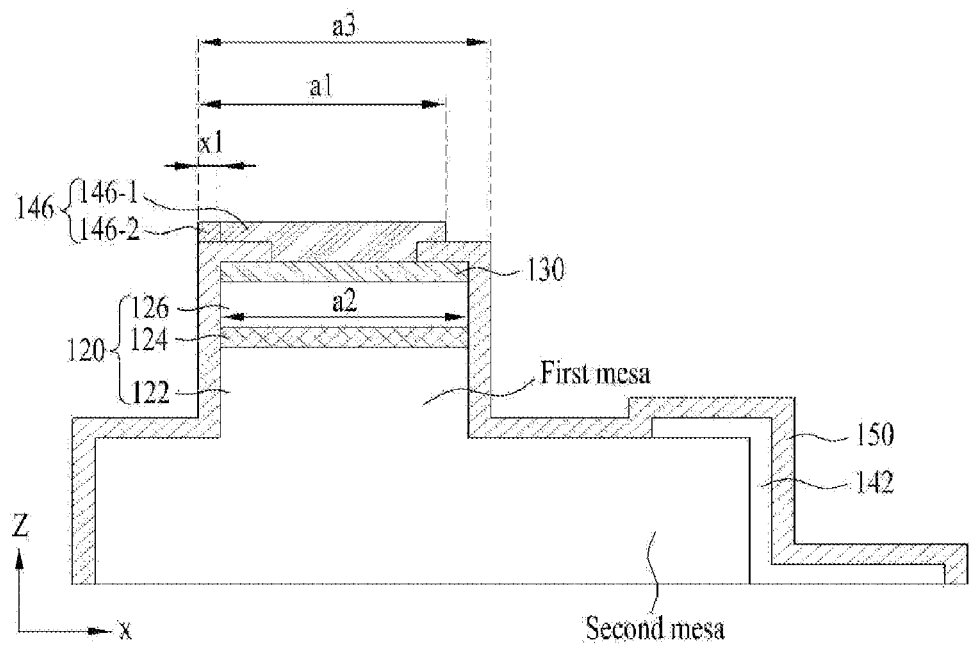
FIG. 1 is a cross-sectional view of an embodiment of a light-emitting element.

Hereinafter, embodiments will be described in detail with reference to the accompanying drawings, in order to concretely realize the above object.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the size of each layer (or each portion) may be exaggerated, omitted or schematically illustrated for clarity and convenience. In addition, the size of each element does not wholly reflect an actual size thereof. In addition, the same reference numerals indicate the same elements throughout the description of the drawings.

FIG. 1 is a cross-sectional view of an embodiment of a light-emitting element.

The light-emitting element of the embodiment may include a light-emitting structure 120 including a first conductive type semiconductor layer 122, an active layer 124, and a second conductive type semiconductor layer 126, a first electrode 142 and a second electrode 146 disposed respectively on the first and second conductive type semiconductor layers, and an insulation layer 150 disposed on the light-emitting structure that is exposed between the first electrode 142 and the second electrode 146.

In addition, in the light-emitting element of the embodiment, the second electrode 146 may include a first portion, which overlaps the second conductive type semiconductor layer 126 in the thickness direction (the Z-direction) of the light-emitting structure, and a second portion, which extends from the first portion and does not overlap the second conductive type semiconductor layer in the thickness direction.

Alternatively, in an embodiment, the light-emitting element may include the light-emitting structure 120 including the first conductive type semiconductor layer 122, the active layer 124, and the second conductive type semiconductor layer 126, the first electrode 142 and the second electrode 146 disposed respectively on the first and second conductive type semiconductor layers 122 and 126, and the insulation layer 150 disposed on the light-emitting structure that exposed between the first electrode 142 and the second electrode 146, and the second electrode and the second conductive type semiconductor layer may be disposed so as to be misaligned with each other in the thickness direction (the Z-direction) of the light-emitting structure.

The light-emitting structure 120 of FIG. 1 may include the first conductive type semiconductor layer 122, the active layer 124 on the first conductive type semiconductor layer, and the second conductive type semiconductor layer 126 disposed on the active layer.

The first conductive type semiconductor layer 122 may be formed of compound semiconductors such as, for example, group III-V or II-Vi compound semiconductors, and may be doped with a first conductive type dopant. The first conductive type semiconductor layer 122 may be formed of a semiconductor material having a composition equation of $Al_xIn_yGa_{(1-x-y)}N$ ($0 \leq x \leq 1$, $1 \leq y \leq 1$, $0 \leq x+y \leq 1$), and for example, may be formed of any one or more of AlGaN, GaN, InAlGaN, AlGaAs, GaP, GaAs, GaAsP, and AlGaInP.

When the first conductive type semiconductor layer 122 is an n-type semiconductor layer, the first conductive type dopant may include an n-type dopant such as, for example, Si, Ge, Sn, Se, or Te. The first conductive type semiconductor layer 122 may be formed in a single layer or in multiple layers, without being limited thereto.

The active layer 124 may be disposed on the first conductive type semiconductor layer 122.

The active layer 124 may be disposed between the first conductive type semiconductor layer 122 and the second conductive type semiconductor layer 126, and may include any one of a single well structure (a double hetero structure), a multi-well structure, a single quantum well structure, a multi quantum well (MOW) structure, a quantum dot structure, and a quantum line structure.

The active layer 124 may have any one or more pair structures of a well layer and a barrier layer using group III-V compound semiconductors, for example, at least one of AlGaN/AlGaN, InGaN/GaN, InGaN/InGaN, AlGaN/GaN, InAlGaN/GaN, GaAs(InGaAs)/AlGaAs, or GaP(InGaP)/AlGaP, without being limited thereto. The well layer may be formed of a material, which has a smaller energy band gap than the energy band gap of the barrier layer.

The second conductive type semiconductor layer 126 may be formed on the surface of the active layer 124 using compound semiconductors. The second conductive type semiconductor layer 126 may be formed of, for example, group III-V or II-VI compound semiconductors, and may be doped with a second conductive type dopant. The second conductive type semiconductor layer 126 may be formed of a semiconductor material having a composition equation of $In_xAl_yGa_{(1-x-y)}N$ ($0 \leq x \leq 1$, $0 \leq y \leq 1$, $0 \leq x+y \leq 1$), and may be formed of any one or more of AlGaN, GaN, AlInN, AlGaAs, GaP, GaAs, GaAsP, and AlGaInP. For example, the second conductive type semiconductor layer 126 may be formed of $Al_xGa_{(1-x)}N$.

When the second conductive type semiconductor layer 126 is a p-type semiconductor layer, the second conductive type dopant may be a p-type dopant such as, for example, Mg, Zn, Ca, Sr or Ba. The second conductive type semiconductor layer 126 may be formed in a single layer or in multiple layers, without being limited thereto.

A conductive layer 130 may further be disposed on the second conductive type semiconductor layer 126.

The conductive layer 130 may improve the electrical characteristics of the second conductive type semiconductor layer 126, and may improve the electrical contact between the second conductive type semiconductor layer 126 and the second electrode 146. The conductive layer 130 may be formed in multiple layers or may have a pattern. The conductive layer 130 may be configured as a transparent electrode layer having a light-transmitting property.

The conductive layer 130 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), zinc oxide (ZnO), iridium oxide (IrOx), ruthenium oxide (RuOx), nickel oxide (NiO), RuOx/ITO, or Ni/IrOx/Au(Gold), and is not limited to these materials.

Referring to FIG. 1, the light-emitting structure 120 may include at least one mesa area. Here, the mesa area corresponds to the area including the upper surface and the side surface of a structure that is formed by mesa etching.

The light-emitting structure may include a first mesa area, and the first conductive type semiconductor layer may include a second mesa area.

For example, in FIG. 1, the first mesa area may include the first conductive type semiconductor layer 122, the active layer 124, and the second conductive type semiconductor layer 126, and the second mesa area may include only the first conductive type semiconductor layer 122. In addition, the first mesa area may be disposed on the second mesa area.

Although the side surfaces of the first mesa area and the second mesa area are illustrated as being close to vertical in FIG. 1, the embodiment is not limited thereto, and the side surface of the mesa area may be obliquely inclined at a predetermined angle relative to the bottom surface of the light-emitting element.

The first electrode 142 and the second electrode 146 may be disposed respectively on the first conductive type semiconductor layer 122 and the second conductive type semiconductor layer 126.

The first electrode 142 and the second electrode 146 may be formed in a single layer or in multiple layers using a conductive material, for example, a metal or an alloy selected from among indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chrome (Cr), molybdenum (Mo), niobium (Nb), aluminum (Al), nickel (Ni), copper (Cu), and titanium tungsten alloy (WTi), without being limited thereto.

The first electrode 142 may be disposed on a portion of the second mesa area. That is, the first electrode 142 may be disposed on a portion of the first conductive type semiconductor layer 122 that is exposed by mesa etching.

For example, the first electrode 142 may be spaced apart from the side surface of the first mesa area by a predetermined distance d and be disposed on the second mesa area. For example, the distance d may range from 2 μm to 10 μm. The first electrode 142, which is spaced apart from the side surface of the first mesa area and is disposed on a portion of the first conductive type semiconductor layer of the second mesa area, may be formed so as to extend to the edge of the second mesa area. In addition, in the embodiment of FIG. 1, the first electrode 142 may be formed so as to extend along a portion of the upper surface of the first conductive type semiconductor layer 122, i.e. the upper surface of the second mesa area and the side surface of the second mesa area and to extend outward from the edge of the second mesa area.

For example, the horizontal width W1 of the portion, which is disposed on the upper surface of the second mesa area, among the first electrode 142 may range from 5 μm to 15 μm, and specifically, may be 10 μm. In addition, the horizontal width W1+W2 of the entire first electrode 142 including a portion on the upper surface and the side surface of the second mesa area and a portion extending from the edge of the second mesa area may range from 10 μm to 40 μm, and specifically, may be 27 μm.

The first electrode 142 may include an ohmic layer, a reflective layer, and a coupling layer. The ohmic layer of the first electrode may be formed of chrome (Cr) or silver (Ag), the reflective layer may be formed of any one or an alloy of platinum (Pt) and gold (Au), nickel (Ni) and gold (Au), aluminum (Al) and platinum (Pt) and gold (Au), and aluminum (Al) and nickel (Ni) and gold (Au), and the coupling layer may include titanium (Ti).

The ohmic layer of the first electrode 142 may facilitate the easy coupling between the first conductive type semiconductor layer 122 and the reflective layer, and the coupling layer may be formed for the coupling between the reflective layer and the insulation layer 150.

Meanwhile, the first electrode 142 may be disposed so that a first surface thereof comes into contact with the insulation layer 150, which will be described below, and a portion of the second surface facing the first surface is exposed outward.

In the embodiment of FIG. 1, the second electrode 146 may be disposed on the second conductive type semiconductor layer 126.

In addition, when the conductive layer 130 is further provided on the second conductive type semiconductor layer 126, the second electrode 146 may be disposed on the conductive layer 130.

The second electrode 146 may include an ohmic layer and a reflective layer.

The ohmic layer of the second electrode may be formed of chrome, silver or titanium. The ohmic layer may facilitate the coupling between the conductive layer and the reflective layer.

In addition, the reflective layer of the second electrode may be any one or an alloy of platinum (Pt) and gold (Au), nickel (Ni) and gold (Au), aluminum (Al) and platinum (Pt) and gold (Au), and aluminum (Al) and nickel (Ni) and gold (Au).

In the embodiment of FIG. 1, a portion of the second electrode 146 may be disposed on an open area of the insulation layer 150, which will be described below.

In the embodiment of FIG. 1, the insulation layer 150 may be disposed on the light-emitting structure 120, which is exposed between the first electrode 142 and the second electrode 146.

In addition, the insulation layer 150 may be disposed on the exposed surface of the light-emitting structure 120 and on the first electrode 142.

The insulation layer 150 may be disposed on the first mesa area and the second mesa area of the light-emitting structure 120 shown in FIG. 1, and may include an open area configured to expose the second conductive type semiconductor layer 126 on the first mesa area.

In addition, in the first mesa area of FIG. 1, at least a portion of the second conductive type semiconductor layer 126, the insulation layer 150, and the second electrode 146 may be disposed with being overlapped with each other at the outer periphery of the open area in which the second conductive type semiconductor layer 126 or the conductive layer 130 is open.

Meanwhile, at least a portion of the second electrode 146 may be disposed in the open area. Here, the second electrode 146 may come into contact with the second conductive type semiconductor layer 126.

The insulation layer 150 may be formed of an insulation material in order to prevent the electrical contact between the first conductive type semiconductor layer 122 and the second conductive type semiconductor layer 126.

The insulation layer 150 may be formed of, for example, $SiO_2$, $Si_3N_4$, or polyimide.

In addition, the insulation layer 150 may be formed of a material having high reflectivity in order to increase the efficiency with which light is emitted from the light-emitting structure, and may have, for example, a DBR structure.

Figure 2:
FIG. 2 is a view illustrating an embodiment of an insulation layer.
Figure 2:
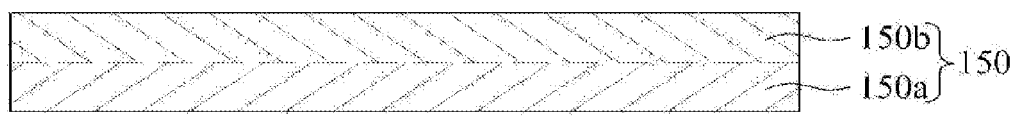

That is, a DBR structure may be configured by repeatedly disposing two types of materials, having different indices of refraction, several or dozens of times. FIG. 2 is a view illustrating an embodiment of the insulation layer, and in the insulation layer of FIG. 2, a first layer 150a and a second layer 150b are repeatedly disposed.

The first layer 150a and the second layer 150b may be formed of, for example, $TiO_2$ and $SiO_2$, or $Ta_2O_5$ and $SiO_2$. When the first layer 150a and the second layer 150b are formed of, for example, $TiO_2$ and $SiO_2$, the first layer 150a and the second layer 150b may be alternately disposed in threes. Here, the thicknesses of the first layers 150a may be 0.75 nm, 0.82 nm, and 0.75 nm respectively, and the thicknesses of the second layers 150b may be 0.50 nm, 0.43 nm, and 0.50 nm respectively.

Referring again to FIG. 1, the second electrode 146 may include a first portion 146-1 which overlaps the second conductive type semiconductor layer 126 and a second portion 146-2 which does not overlap the second conductive type semiconductor layer, in the thickness direction of the light-emitting structure 120, i.e. in the z-direction of the coordinates illustrated in FIG. 1.

The second portion 146-2 of the second electrode may extend from the first portion 146-1, and the first portion and the second portion may be integrally formed with each other.

Meanwhile, the side surface of the second electrode may not completely coincide with the side surface of the second conductive type semiconductor layer, but may be misaligned with the same.

For example, the center of the second electrode and the center of the second conductive type semiconductor layer may not coincide with each other in the thickness direction.

In addition, in the light-emitting element of an embodiment, the side surface of the second electrode may be disposed between the extension plane of the side surface of the second conductive type semiconductor layer and the extension plane of the side surface of the insulation layer, which is disposed on the first mesa area.

For example, in FIG. 1, when the length of one side of the second electrode in a first direction is a1, the corresponding length of one side of the second conductive type semiconductor layer is a2, and the corresponding distance between opposite edges of the insulation layer, which face each other in the first direction, on the first mesa area is a3, the relationship a2<a1<a3 may be established. The first direction may be the horizontal direction, and in FIG. 1, may be the x-direction.

That is, when the length a1 of one side of the second electrode is greater than the corresponding length a2 of one side of the second conductive type semiconductor layer, a light-leakage phenomenon may be minimized in a gap between the second electrode and the second conductive type semiconductor layer disposed one above another. In addition, when the distance a3 between opposite edges of the insulation layer is greater than the width a1 of the second electrode, the disposed insulation layer may prevent an electrically short-circuit that may be caused by the second electrode.

Figure 3A:
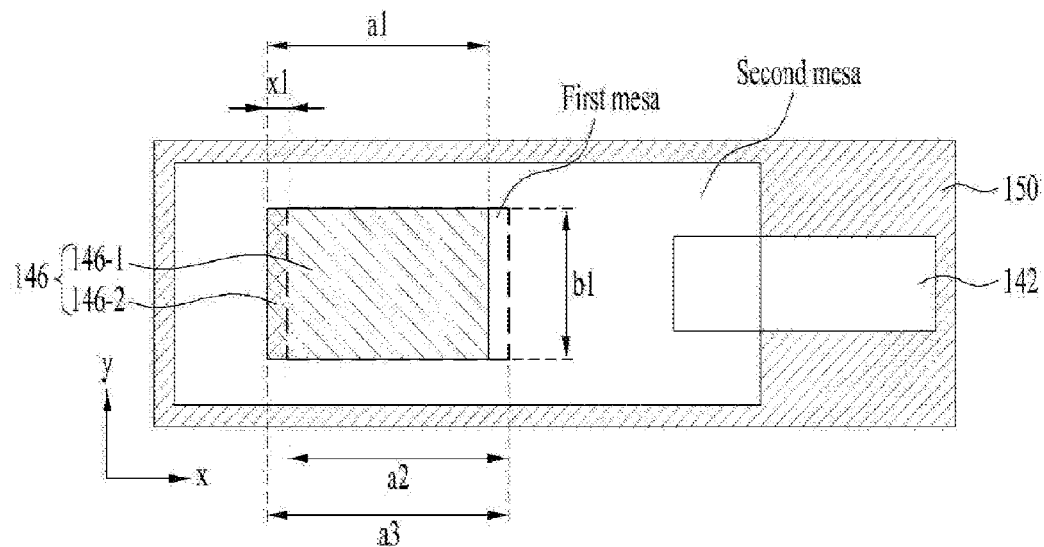
FIGS. 3a and 3b are plan views illustrating an embodiment of the light-emitting element.
Figure 3B:
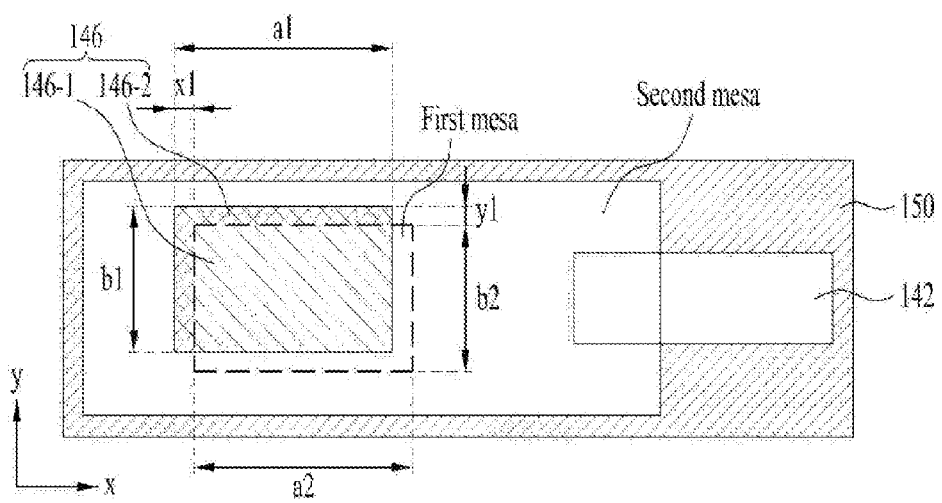

FIGS. 3a and 3b may be plan views of the light-emitting element according to an embodiment, and illustrate the upper surface of the light-emitting element shown in FIG. 1 according to the embodiment.

Referring to FIGS. 3a and 3b, in the light-emitting element of an embodiment, the upper surface of the first mesa area including the second electrode 146 and the second conductive type semiconductor layer may have a rectangular shape.

However, the embodiment is not limited thereto, and the second electrode and the upper surface of the first mesa area may be formed so as to have curved corner portions.

In addition, in FIGS. 3a and 3b, the portion designated as the first mesa area may correspond to the second conductive type semiconductor layer.

In the embodiment of FIG. 3a, the second portion 146-2 of the second electrode may be disposed so as to deviate from the extension plane of one side surface of the second conductive type semiconductor layer 126.

In FIG. 3a, the second electrode 146 may be disposed with being moved in the x-direction on the basis of the portion thereof that overlaps the second conductive type semiconductor layer in the thickness direction of the light-emitting structure.

For example, the second electrode 146 may be disposed so as to outwardly deviate from one side surface of the first mesa area including the second conductive type semiconductor layer by the distance x1.

That is, the second portion 146-2 of the second electrode may be disposed with being moved in the x-direction from one side surface of the second conductive type semiconductor layer.

For example, the moved distance x1 in the x-direction may range from 1% to 15% of the width a2 of the first mesa area. In addition, specifically, the distance x1 may range from 3% to 7% of the width a2.

A misaligned distance x1, which is the distance by which the second electrode 146 deviates from the side surface of the second conductive type semiconductor layer to one side, may range from 1 μm to 4 μm.

When the distance x1 is less than 1 μm, a processing margin may not be secured when the second electrode is formed. When the distance x1 is greater than 4 μm, the optical characteristics of the light-emitting element may be deteriorated due to a light-leakage phenomenon in an emitting area.

FIG. 3b is a plan view of another embodiment of the light-emitting element illustrated in cross section in FIG. 1.

In the embodiment of FIG. 3b, the second electrode 146 may be disposed with being moved in the x-direction and the y-direction on the basis of the portion thereof that overlaps the second conductive type semiconductor layer.

For example, the second electrode 146 may be formed with further extending from the portion that overlaps the second conductive type semiconductor layer by the distance x1 in the x-direction and the distance y1 in the y-direction, at two side surfaces of the first mesa area including the second conductive type semiconductor layer.

That is, the second electrode may be disposed so as to outwardly deviate from the two side surfaces among the side surfaces of the first mesa area.

In addition, the second portion 146-2 of the second electrode may be disposed to be moved in the diagonal direction on the basis of the second conductive type semiconductor layer. Here, the center of the second electrode 146 and the center of the second conductive type semiconductor layer in the plane (x-y plane) perpendicular to the thickness direction may not coincide with each other in the thickness direction.

For example, the width x1 of the extended portion of the second electrode in the x-direction may range from 1% to 15% of the horizontal width a2 of the first mesa area, and specifically, may range from 3% to 7% of the width a2.

In addition, the width y1 of the extended portion of the second electrode in the y-direction may range from 1% to 7% of the vertical width b2 of the first mesa area, and specifically, may range from 3% to 5% of the width b2.

Figure 4:
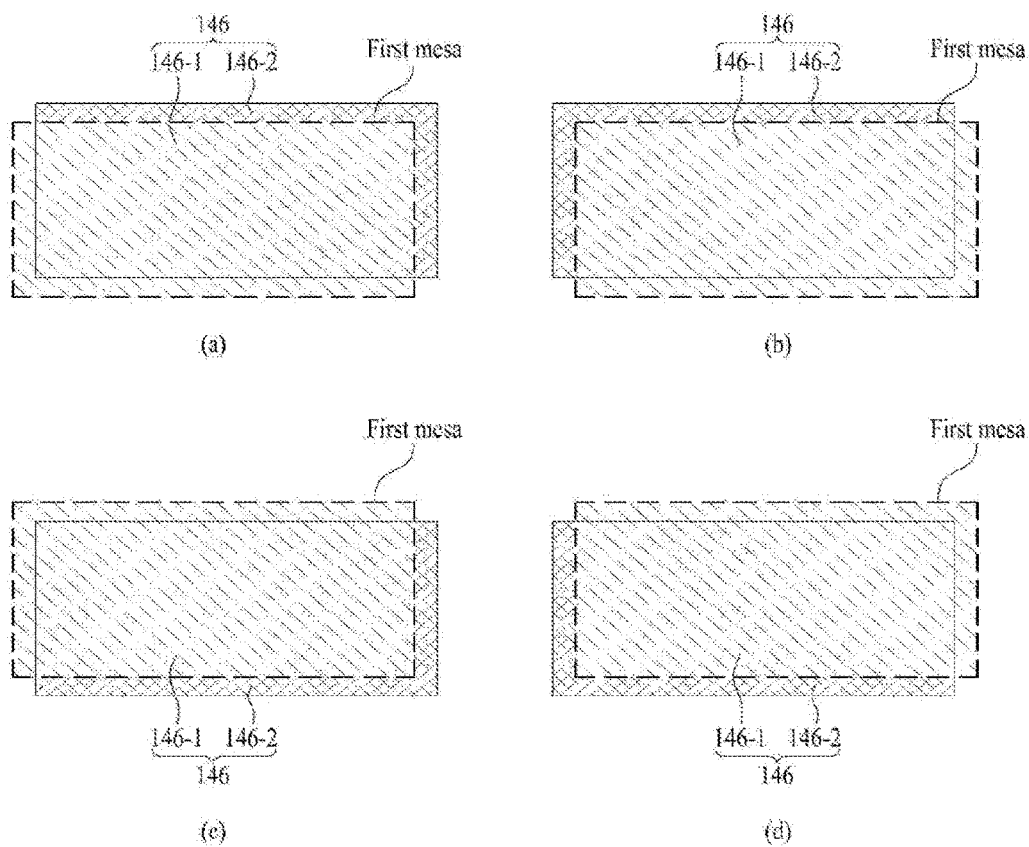
FIG. 4 is a view illustrating embodiments of the arrangement of a second electrode.

FIG. 4 is a view schematically illustrating embodiments of the arrangement of the second electrode 146 on the basis of the first mesa area.

All of (a) to (d) in FIG. 4 illustrate the case where the second electrode is disposed so as to deviate by predetermined distances in the x-direction and the y-direction on the basis of the first mesa area.

In FIG. 4, (a) schematically illustrates an embodiment in the case where the second portion 146-2 of the second electrode is disposed so as to deviate in the upper right direction from the first mesa area, and (b) schematically illustrates an embodiment in the case where the second portion 146-2 of the second electrode is disposed so as to deviate in the upper left direction from the first mesa area.

In FIG. 4, (c) schematically illustrates an embodiment in the case where the second portion 146-2 of the second electrode is disposed so as to deviate in the lower right direction from the first mesa area, and (d) schematically illustrates an embodiment in the case where the second portion 146-2 of the second electrode is disposed so as to deviate in the lower left direction from the first mesa area.

Referring to (a) to (d) in FIG. 4, for example, when the second electrode 146 and the first mesa area have a rectangular shape and have the same horizontal cross-sectional area, the center of the horizontal cross section of the second electrode may be disposed with being moved in the diagonal direction from the center of the horizontal cross section of the first mesa area.

In the embodiments of FIGS. 1 to 4, the area of the upper surface of the second electrode may be the same as the horizontal cross-sectional area of the second conductive type semiconductor layer. Here, the horizontal cross-sectional area of the second conductive type semiconductor layer may be the area of the horizontal plane of the second conductive type semiconductor layer, which is perpendicular to the thickness direction of the light-emitting structure.

For example, the horizontal plane may be the x-y plane in FIGS. 3a, 3b and 4.

Alternatively, the area of the upper surface of the second electrode 146 may be greater than the horizontal cross-sectional area of the second conductive type semiconductor layer 126, and may be equal to or less than the horizontal cross-sectional area of the portion that includes the second conductive type semiconductor layer 126 and the insulation layer 150 disposed on the second conductive type semiconductor layer.

FIGS. 5 to 8 views illustrating another embodiment of the light-emitting element.

In the following description related to the embodiments of the light-emitting element in FIGS. 5 to 8, a repeated description of components common to those of the above-described embodiments will be omitted, and only differences will be described.

Figure 5:
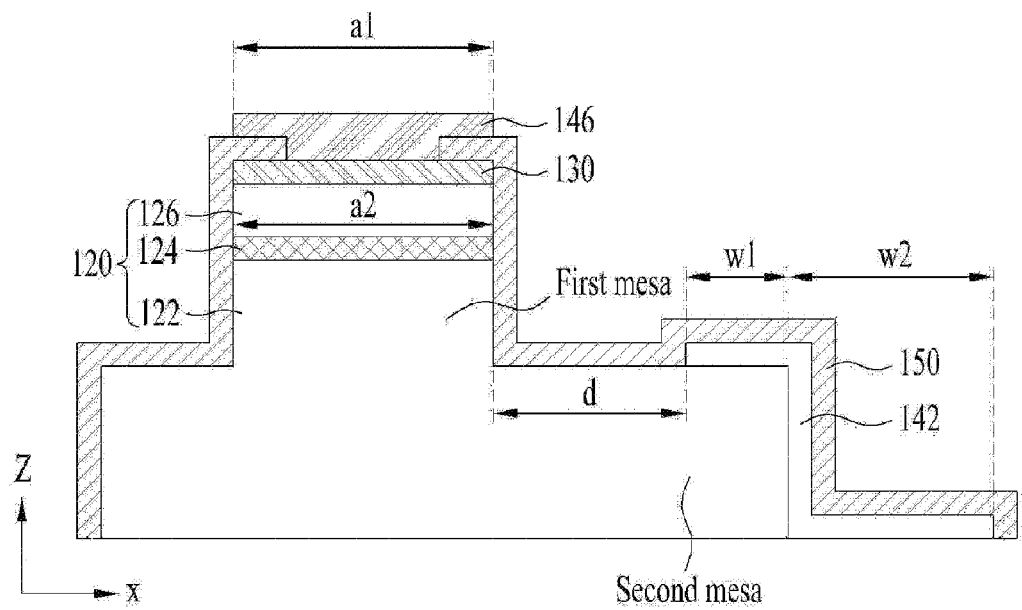
FIG. 5 is a cross-sectional view illustrating another embodiment of the light-emitting element.

FIG. 5 is a cross-sectional view illustrating an another embodiment of the light-emitting element.

In the embodiment of FIG. 5, at least one side surface among side surfaces of the second electrode 146 may be disposed on the same plane as at least one side surface of the second conductive type semiconductor layer 126.

In addition, when the maximum width of the second electrode 146 in the horizontal direction is a1 and the maximum width of the second conductive type semiconductor layer 126 in the horizontal direction is a2, the relationship a1=a2 may be established.

Figure 6:
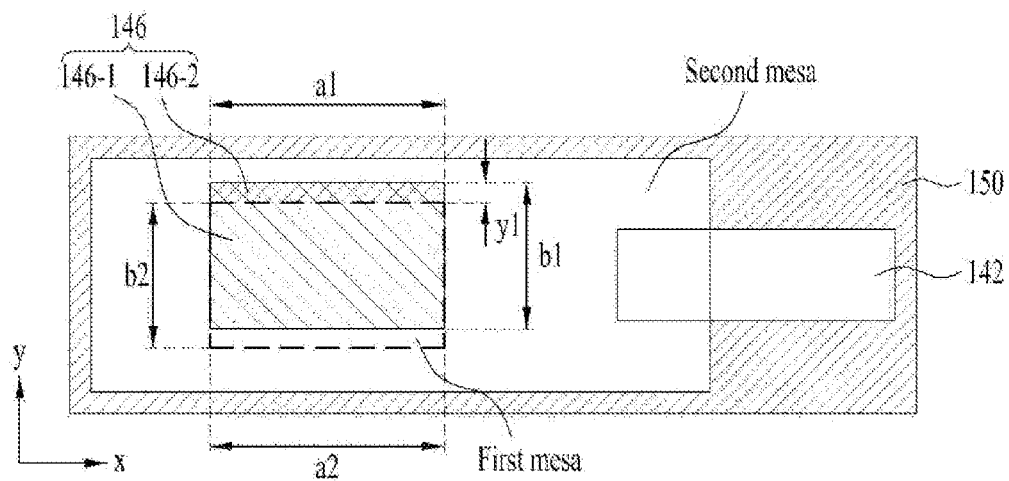
FIG. 6 is a plan view illustrating the another embodiment of the light-emitting element.

FIG. 6 may be a view illustrating the upper surface of the light-emitting element having a cross-sectional view shown in FIG. 5.

In the case of the embodiment of FIG. 6, when the length of one side of the second electrode 146 in the x-direction is a1 and the length of one side of the second electrode 146 in the y-direction is b1 and when the corresponding lengths of one side of the second conductive type semiconductor layer included on the first mesa area are a2 and b2, the relationship a1=b1 and a2=b2 may be established.

In addition, referring to the plan view of FIG. 6, the second electrode 146 may be disposed with being moved by the distance y1 in the y-direction on the basis of the second conductive type semiconductor layer.

That is, the second portion 146-2 of the second electrode may be disposed with being moved in the y-direction from the first mesa area.

In the embodiment of FIGS. 5 and 6, the area of the upper surface of the second electrode 146 may be the same as the horizontal cross-sectional area of the second conductive type semiconductor layer.

Figure 7:
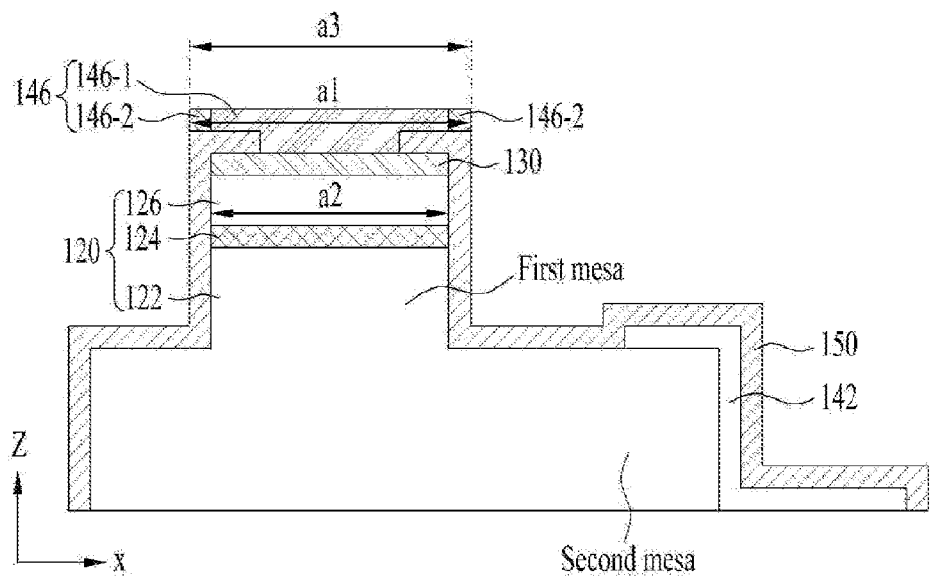
FIG. 7 is a cross-sectional view illustrating still another embodiment of the light-emitting element.

FIG. 7 is a cross-sectional view illustrating still another embodiment of the light-emitting element.

At least one side surface of the second electrode 146 may be disposed in the same plane as at least one side surface of the insulation layer 150 disposed on the second conductive type semiconductor layer 126.

Referring to FIG. 7, the side surface of the second electrode 146 may be disposed on the same plane as the side surface of the insulation layer 150 on the first mesa area.

For example, in the embodiment of FIG. 7, when the maximum width of the second electrode 146 in the first direction is a1 and the distance between opposite side surfaces of the insulation layer 150 on the first mesa area is a3, the relationship a1=a3 may be established.

Here, the first direction may be the horizontal direction, and may be the x-direction in FIG. 7.

In addition, although not illustrated in drawings, the side surface of the second electrode 146 may be disposed between the extension plane of the side surface of the semiconductor layer 126 and the extension plane of the side surface of the insulation layer 150 on the first mesa area.

For example, when the maximum width of the second electrode 146 in the first direction is a1, the width of the second conductive type semiconductor layer 126 in the first direction is a2, and the distance between opposite side surfaces, being facing to each other in the first direction, of the insulation layer 150 on the first mesa area is a3, the relationship a2<a1<a3 may be established. Here, the first direction may be the horizontal direction.

Figure 8:
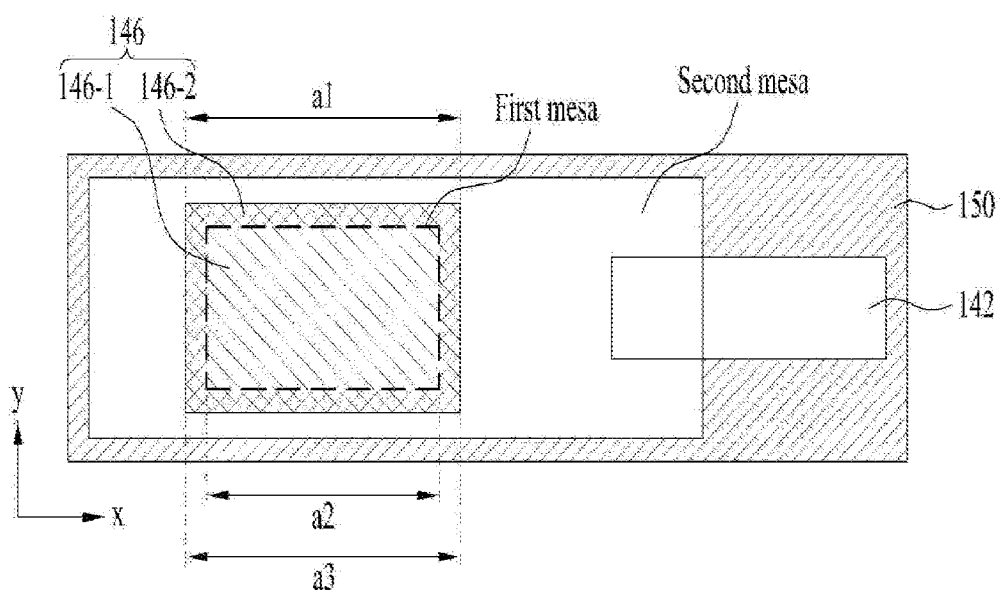
FIG. 8 is a plan view illustrating the still another embodiment of the light-emitting element.

FIG. 8 is a plan view illustrating the embodiment of the light-emitting element shown in FIG. 7.

In the embodiment of FIGS. 7 and 8, the area of the upper surface of the second electrode 146 may be the same as the area of the horizontal cross section, the rim of which is the side surface of the insulation layer on the first mesa area.

In addition, in the embodiment of FIGS. 7 and 8, the area of the upper surface of the second electrode 146 may be greater than the horizontal cross-sectional area of the second conductive type semiconductor layer 126 and may be equal to or less than the area of the horizontal cross section, the rim of which is the side surface of the insulation layer 150 on the first mesa area.

In the case of the light-emitting element of the above-described embodiment, the second electrode is formed so as to include the portion that does not overlap the second conductive type semiconductor layer in the thickness direction of the light-emitting structure. This may increase the range over which the precision of alignment is managed in the process of disposing the second electrode on the light-emitting structure, thereby increasing the productivity of the second electrode forming process.

In addition, by adjusting the length of the portion of the second electrode that does not overlap the second conductive type semiconductor layer in the thickness direction of the light-emitting structure, a light-leakage phenomenon may be minimized. In addition, by preventing the second electrode from deviating from the edge of the insulation layer disposed on the first mesa area, a short-circuit may be prevented.

Figure 9:
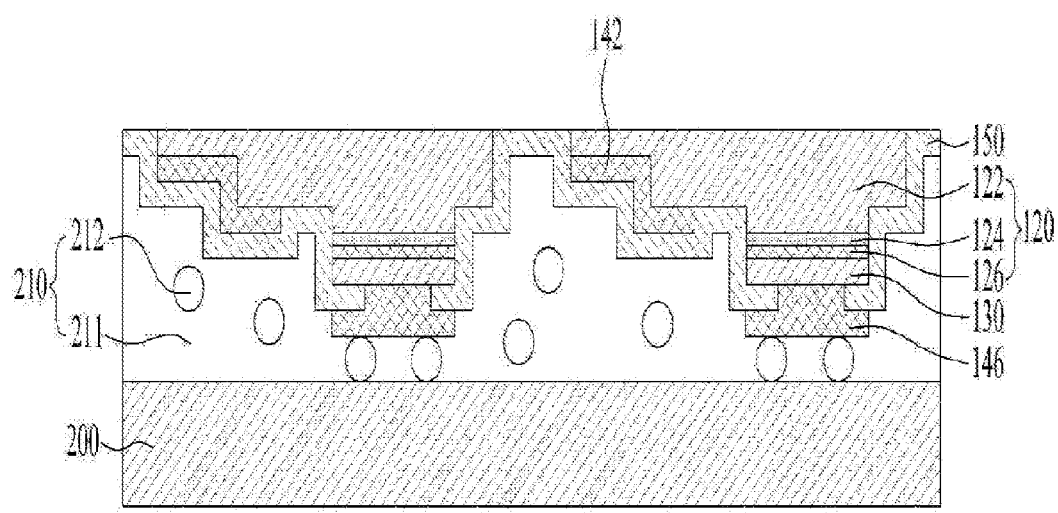
FIG. 9 is a view illustrating an embodiment of a light-emitting element array.

FIG. 9 is a view illustrating an embodiment of a light-emitting element array including the light-emitting element of the above-described embodiment.

The light-emitting element array may include a circuit board 200, a plurality of light-emitting elements disposed on the circuit board, and a resin layer 210, which is filled up with between the circuit board and each light-emitting element and includes conductive balls 212, and the conductive balls 212 may be in contact with each of the circuit board 200 and the second electrode 146.

The circuit board 200 may be a printed circuit board (PCB) or a flexible printed circuit board (FPCB).

An electrode pattern may be formed on the surface of the circuit board 200 at a position at which it faces the second electrode 146 of the light-emitting element. For example, the electrode pattern formed on the circuit board 200 may be electrically connected to the second electrode 146 of each of the light-emitting elements.

When the flexible printed circuit board (FPBC) having flexibility is used as the circuit board 200, the entire light-emitting element array may be realized so as to be bendable due to the flexibility of the FPCB that supports the array.

The resin layer 210 may be filled up with between the circuit board 200 and the light-emitting elements.

The resin layer 210 may include a resin portion 211 and the conductive balls 212. In the embodiment of FIG. 9, the resin layer 210 may be an anisotropic conductive film (ACF).

In FIG. 9, the conductive balls 212 may be disposed between the second electrode 146 and the circuit board 200, and the second electrode 146 and the circuit board 200 may be electrically connected by the conductive balls 212.

The electrical connection using the conductive balls 212 may be implemented by applying heat and pressure to the conductive balls so as to cause the conductive balls to be brought into contact with both the electrode pattern formed on the circuit board and the second electrode of the light-emitting element in the fabrication of the light-emitting element array.

In addition, the first electrode 142 of the light-emitting element is exposed to the outside. The first electrodes 142 of the neighboring light-emitting elements may be interconnected using a separate single wire in the direction opposite the circuit board, and may then be connected to the circuit board 200.

The light-emitting element array described above has a several micrometer height excluding the circuit board, and one light-emitting element may have respective horizontal and vertical lengths within 100 micrometers. For example, the light-emitting element may have a rectangular shape having a horizontal length of 82 μm and a vertical length of 30 μm.

The light-emitting elements may be aligned in rows and columns and may be disposed to correspond to pixels in various display apparatuses. For example, 400 to 1080 light-emitting elements may be aligned in the horizontal direction and the vertical direction, respectively, to configure pixels of a display apparatus.

The light-emitting element array of the above-described embodiment may be used in apparatuses that require precision, owing to the small size of light-emitting elements, and may achieve increased productivity since the second electrode may be disposed on the second conductive type semiconductor layer with a processing margin therebetween.

The light-emitting element array of the above-described embodiment may be included in a wearable device.

FIG. 10 is a view illustrating an embodiment of a smart watch 300 including the light-emitting element array.

The smart watch 300 may perform pairing with an external digital device, and the external digital device may be a digital device that enables communication connection with the smart watch 300, and for example, may include a smart phone 400, a laptop computer 410, or an Internet Protocol Television (IPTV) 420.

The light-emitting element array 310 described above may be used as a light source of the smart watch 300. The smart watch 300 is wearable on the wrist due to the flexibility of the FPCB, and may realize fine pixels due to the fine size of the light-emitting elements.

Hereinafter, an image display apparatus and a lighting apparatus will be described as one embodiment including the light-emitting element array described above.

Optical members such as, for example, a light guide plate, a prism sheet, and a diffuser sheet may be disposed in the optical path of the light-emitting elements of the light-emitting element array according to the embodiment. The light-emitting element array, a board, and the optical members may function as a backlight unit.

In addition, a display apparatus, an indicator apparatus, and a lighting apparatus may be realized to include the light-emitting element array according to the embodiment.

Here, the display apparatus may include a bottom cover, a reflector disposed on the bottom cover, a light guide plate disposed in front of a light-emitting element array, which emits light, and a reflector so as to guide the light emitted from the light-emitting element array forward, an optical sheet including prism sheets disposed in front of the light guide plate, a display panel disposed in front of the optical sheet, an image signal output circuit connected to the display panel to supply image signals to the display panel, and a color filter disposed in front of the display panel. Here, the bottom cover, the reflector, the light-emitting element array, the light guide plate, and the optical sheet may constitute a backlight unit.

In addition, the lighting apparatus may include a light source module having a board and the light-emitting element array according to the embodiment, a radiator configured to radiate heat from the light source module, and a power supply unit configured to process or convert electrical signals received from the outside so as to supply the same to the light source module. For example, the lighting apparatus may include a lamp, a headlamp, or a street light.

In the case of the image display apparatus and the lighting apparatus described above, by including the light-emitting element array of the above-described embodiment, the apparatus size may be reduced and fewer limitations may be imposed on the design due to the flexibility of the light-emitting element array.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

INDUSTRIAL APPLICABILITY

A light-emitting element according to embodiments is used in a light-emitting element array and is configured to limit the range over which a second electrode deviates from the emitting area of a light-emitting structure, which may minimize a light-leakage phenomenon and secure a processing margin, resulting in increased productivity.

The invention claimed is:

1. A light-emitting element, comprising:
a light-emitting structure including a first conductive type semiconductor layer, an active layer, and a second conductive type semiconductor layer;
first and second electrodes disposed respectively on the first and second conductive type semiconductor layers; and
an insulation layer disposed on the light-emitting structure that is exposed between the first electrode and the second electrode,
wherein the second electrode includes:
a first portion configured to overlap the second conductive type semiconductor layer in a thickness direction of the light-emitting structure; and
a second portion configured to extend from the first portion so as not to overlap the second conductive type semiconductor layer in the thickness direction,
wherein a width of the second portion of the second electrode in a first direction ranges from 1μm to 4μm,
wherein the first direction intersects the thickness direction of the light-emitting structure,
wherein the light-emitting structure includes a first mesa area and the first conductive type semiconductor layer includes a second mesa area,
wherein the insulation layer is disposed on the first mesa area and the second mesa area, and the insulation layer includes an open area in which the second conductive type semiconductor layer is exposed on the first mesa area,
wherein at least a portion of the second electrode is disposed on the open area of the insulation layer, and
wherein at least a portion of the second conductive type semiconductor layer, the insulation layer, and the second electrode overlap one another at an outer periphery of the open area on the first mesa area.

2. A light-emitting element, comprising:
a light-emitting structure including a first conductive type semiconductor layer, an active layer, and a second conductive type semiconductor layer;
first and second electrodes disposed respectively on the first and second conductive type semiconductor layers; and
an insulation layer disposed on the light-emitting structure that is exposed between the first electrode and the second electrode,
wherein the second electrode and the second conductive type semiconductor layer are disposed so as to deviate by a misalignment distance, in a thickness direction of the light-emitting structure,
wherein the misalignment distance in a first direction intersecting the thickness direction of the light-emitting structure ranges from 1μm to 4μm,
wherein the light-emitting structure includes a first mesa area and the first conductive type semiconductor layer includes a second mesa area,
wherein the insulation layer is disposed on the first mesa area and the second mesa area, and the insulation layer includes an open area in which the second conductive type semiconductor layer is exposed on the first mesa area,
wherein at least a portion of the second electrode is disposed on the open area of the insulation layer, and
wherein at least a portion of the second conductive type semiconductor layer, the insulation layer, and the second electrode overlap one another at an outer periphery of the open area on the first mesa area.

3. The light-emitting element according to claim 2, wherein a width of an upper surface of the second electrode in the first direction is a1, a width of the second conductive type semiconductor layer in the first direction is a2, a distance between opposite edges of the insulation layer that face each other in the first direction on the first mesa area is a3, and a relationship a2<a1<a3 is established.

4. The light-emitting element according to claim 3, wherein the misalignment distance ranges from 1% to 15% of the a2.

5. The light-emitting element according to claim 2, wherein a width of an upper surface of the second electrode in a first direction is a1, a width of the second conductive type semiconductor layer in the first direction is a2, and a relationship a1=a2 is established.

6. The light-emitting element according to claim 2, wherein a width of an upper surface of the second electrode in the first direction is a1, a width of the upper surface of the second electrode in a second direction, which intersects the first direction, is b1, a width of an upper surface of the second conductive type semiconductor layer in the first direction that is included in the first mesa area is a2, a width of the upper surface of the second conductive type semiconductor layer in the second direction, which intersects the first direction, is b2, and a relationship a1=b1 and a2=b2 is established.

7. The light-emitting element according to claim 2, wherein an area of an upper surface of the second electrode is the same as a horizontal cross-sectional area of the second conductive type semiconductor layer, and the horizontal cross-sectional area is an area of a horizontal plane perpendicular to the thickness direction.

8. The light-emitting element according to claim 2, wherein at least one side surface of the second electrode is disposed on the same plane as at least one side surface of the second conductive type semiconductor layer.

9. The light-emitting element according to claim 2, wherein an area of an upper surface of the second electrode is greater than a horizontal cross-sectional area of the second conductive type semiconductor layer and is equal to or less than a horizontal cross-sectional area including the insulation layer disposed on the second conductive type semiconductor layer and the second conductive type semiconductor layer, and
wherein the horizontal cross-sectional area is an area of a horizontal plane perpendicular to the thickness direction.

10. The light-emitting element according to claim 2, wherein at least one side surface of the second electrode is disposed on the same plane as at least one side surface of the insulation layer disposed on the second conductive type semiconductor layer.

11. The light-emitting element according to claim 2, wherein a side surface of the second electrode is disposed between an extension plane of a side surface of the second conductive type semiconductor layer and an extension plane of a side surface of the insulation layer on the first mesa area.

12. The light-emitting element according to claim 2, wherein the first electrode is disposed on a portion of the second mesa area, and
wherein the first electrode is disposed on a side surface of the second mesa area and extends from an edge of the side surface.

13. The light-emitting element according to claim 2, wherein the first electrode includes an ohmic layer, a reflective layer, and a coupling layer,
wherein the second electrode includes an ohmic layer and a reflective layer, and
wherein the insulation layer has a DBR structure, and the DBR structure is a structure in which $TiO_2$ and $SiO_2$, or $Ta_2O_5$ and $SiO_2$ are repeatedly disposed at least two times.

14. The light-emitting element according to claim 2, wherein the first electrode comes into contact at a first surface thereof with the insulation layer, and a portion of a second surface that faces the first surface is exposed.

15. A light-emitting element array, comprising:
a circuit board;
a plurality of light-emitting elements according to claim 2 disposed on the circuit board; and
a resin layer filled up with between the circuit board and the light-emitting elements and including a conductive ball,
wherein the conductive ball is in contact with each of the circuit board and the second electrodes of the light-emitting elements.

16. The light-emitting element according to claim 15, wherein the first electrodes of the light-emitting elements are interconnected using a single electrode wire in a direction opposite to the circuit board.

17. The light-emitting element according to claim 2, wherein a center of the second electrode and a center of the second conductive type semiconductor layer in a plane view are not coincide with each other in the thickness direction.

18. The light-emitting element according to claim 4, wherein the misalignment distance ranges from 3% to 7% of the a2.

19. The light-emitting element according to claim 2, wherein a center of a horizontal cross section of the second electrode is disposed with being moved in a diagonal direction from the center of a horizontal cross section of the first mesa area.

* * * * *